US010436847B2

(12) United States Patent
Iwane et al.

(10) Patent No.: US 10,436,847 B2
(45) Date of Patent: Oct. 8, 2019

(54) SECONDARY BATTERY STATE DETECTION DEVICE AND SECONDARY BATTERY STATE DETECTION METHOD (71) Applicants: FURUKAWA ELECTRIC CO., LTD., Tokyo (JP); Furukawa Automotive Systems Inc., Shiga (JP)

(72) Inventors: Noriyasu Iwane, Tokyo (JP); Naoya Takashima, Tokyo (JP); Taiji Mitsuyama, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 286 days.

(21) Appl. No.: 15/281,089

(22) Filed: Sep. 30, 2016

(65) Prior Publication Data
US 2017/0016962 A1    Jan. 19, 2017

Related U.S. Application Data (63) Continuation of application No. PCT/JP2015/058389, filed on Mar. 19, 2015.

(30) Foreign Application Priority Data

Apr. 1, 2014    (JP) .................................. 2014-075793

(51) Int. Cl.
G01N 27/416    (2006.01)
G01R 31/367    (2019.01)
(Continued)

(52) U.S. Cl.
CPC ............ G01R 31/367 (2019.01); B60L 53/80 (2019.02); B60L 58/16 (2019.02); G01R 31/374 (2019.01);
(Continued)

(58) Field of Classification Search
CPC ............ G01R 31/3624; G01R 31/3662; G01R 31/3679; G01R 31/3651; G01R 31/3675;
(Continued)

(56) References Cited

U.S. PATENT DOCUMENTS 8,274,291 B2 * 9/2012 Tsuchiya ............ G01R 31/3675
320/148
8,285,501 B2   10/2012 Kinoshita
(Continued)

FOREIGN PATENT DOCUMENTS

JP    2005221487 A    8/2005
JP    2009510390 A    3/2009
(Continued)

OTHER PUBLICATIONS

International Search Report for PCT Application No. PCT/JP2015/058389 dated Jun. 9, 2015, 4 pages.

Primary Examiner — Minh N Tang
(74) Attorney, Agent, or Firm — Amin, Turocy & Watson, LLP (57) ABSTRACT Described herein are techniques to accurately detect that a secondary battery has been replaced. A secondary battery state detecting device detects a state of a secondary battery installed in a vehicle. The device includes a control unit that learns element values of an equivalent circuit of the secondary battery on the basis of a voltage and a current of the secondary battery. The control unit also compares the element values obtained through learning at different timings and, when at least one of the element values has changed more than or equal to a predetermined threshold value, determines that the secondary battery has been replaced.

10 Claims, 5 Drawing Sheets (51) Int. Cl.
  *G01R 31/374* (2019.01)
  *G01R 31/378* (2019.01)
  *G01R 31/389* (2019.01)
  *G01R 31/3842* (2019.01)
  *H01M 10/48* (2006.01)
  *H02J 7/00* (2006.01)
  *H01M 10/42* (2006.01)
  *B60L 53/80* (2019.01)
  *B60L 58/16* (2019.01)

(52) U.S. Cl.
  CPC ......... *G01R 31/378* (2019.01); *G01R 31/389* (2019.01); *G01R 31/3842* (2019.01); *H01M 10/4285* (2013.01); *H01M 10/48* (2013.01); *H01M 10/486* (2013.01); *H02J 7/0047* (2013.01); *B60L 2240/545* (2013.01); *B60L 2240/547* (2013.01); *B60L 2240/549* (2013.01); *H01M 2220/20* (2013.01); *Y02T 10/705* (2013.01); *Y02T 10/7011* (2013.01); *Y02T 10/7016* (2013.01); *Y02T 10/7072* (2013.01); *Y02T 90/124* (2013.01); *Y02T 90/14* (2013.01)

(58) Field of Classification Search
  CPC .............. H01M 10/48; H01M 10/486; H01M 10/4285; H02J 7/00; H02J 7/0021; H02J 7/007
  See application file for complete search history.

(56) References Cited

U.S. PATENT DOCUMENTS

| 9,176,198 B2 * | 11/2015 | Koch ................ G01R 31/3651 |
| 9,194,919 B2 | 11/2015 | Uesaka |
| 2007/0216407 A1 * | 9/2007 | Yamaguchi ........ G01R 31/3648 324/256 |
| 2014/0091739 A1 * | 4/2014 | Sato ................... B60L 11/1879 318/139 |

FOREIGN PATENT DOCUMENTS

| JP | 2010190663 A | 9/2010 |
| JP | 2013088156 A | 5/2013 |
| JP | 2013132147 A | 7/2013 |

* cited by examiner

| | Rohm [Ω] | Rct [Ω] | C [F] | SOH [Ah] |
|---|---|---|---|---|
| COMPANY A TYPE A-1 | 0.004410 | 0.001989 | 4.3706 | 77.135 |
| COMPANY A TYPE A-2 | 0.004356 | 0.001968 | 4.2885 | 75.722 |
| COMPANY A TYPE A-3 | 0.004278 | 0.001995 | 3.9478 | 75.879 |
| COMPANY B TYPE A-1 | 0.004364 | 0.002910 | 2.6759 | 74.751 |
| COMPANY B TYPE A-2 | 0.004404 | 0.002888 | 2.6631 | 74.399 |
| COMPANY B TYPE A-3 | 0.004370 | 0.002955 | 2.9119 | 72.838 |
| COMPANY C TYPE A-1 | 0.004346 | 0.001459 | 4.1212 | 69.519 |
| COMPANY C TYPE A-2 | 0.004335 | 0.001445 | 4.3450 | 68.763 |
| COMPANY C TYPE A-3 | 0.004559 | 0.001445 | 4.2967 | 71.308 |
| COMPANY A TYPE B-1 | 0.004451 | 0.002567 | 4.1473 | 63.009 |
| COMPANY A TYPE B-2 | 0.004412 | 0.002610 | 3.9830 | 63.116 |
| COMPANY A TYPE B-3 | 0.004563 | 0.002460 | 4.1576 | 62.786 |

FIG. 4

| DEGRADATION MODE | Rohm [mΩ] | Rct [Ω] | C [F] | SOH [Ah] | SOH |
|---|---|---|---|---|---|
| NEW PRODUCT NO. 1 | 7.87 | 0.0053 | 2.29 | 39.6 | 100% |
| NEW PRODUCT NO. 2 | 8.11 | 0.0053 | 2.28 | 39.4 | 100% |
| NEW PRODUCT NO. 3 | 7.96 | 0.0052 | 2.28 | 39.7 | 100% |
| SULFATION DEGRADATION NO. 1 | 8.06 | 0.0054 | 1.43 | 32.0 | 81% |
| SULFATION DEGRADATION NO. 2 | 8.11 | 0.0054 | 1.39 | 31.3 | 80% |
| SULFATION DEGRADATION NO. 3 | 8.04 | 0.0055 | 1.54 | 30.2 | 76% |
| DEEP CHARGE-DISCHARGE CYCLE DEGRADATION NO. 1 | 8.60 | 0.0062 | 1.18 | 21.1 | 53% |
| DEEP CHARGE-DISCHARGE CYCLE DEGRADATION NO. 2 | 8.85 | 0.0061 | 1.22 | 22.6 | 57% |
| DEEP CHARGE-DISCHARGE CYCLE DEGRADATION NO. 3 | 8.65 | 0.0060 | 1.23 | 28.5 | 72% |
| IDLE REDUCTION CYCLE DEGRADATION NO. 1 | 8.92 | 0.0078 | 1.02 | 27.4 | 69% |
| IDLE REDUCTION CYCLE DEGRADATION NO. 2 | 9.86 | 0.0089 | 0.98 | 18.0 | 46% |
| IDLE REDUCTION CYCLE DEGRADATION NO. 3 | 10.62 | 0.0067 | 0.93 | 3.4 | 9% |

SECONDARY BATTERY STATE DETECTION DEVICE AND SECONDARY BATTERY STATE DETECTION METHOD

CROSS-REFERENCE TO RELATED APPLICATIONS

The subject application is a continuation of, and claims priority to, PCT Application Serial No. PCT/JP2015/058389, filed Mar. 19, 2015, and entitled "SECONDARY BATTERY STATE DETECTION DEVICE AND SECONDARY BATTERY STATE DETECTION METHOD", which claims priority to Japanese Patent Application Serial No. 2014-075793, filed Apr. 1, 2014, which applications are hereby incorporated herein by reference in their respective entireties.

TECHNICAL FIELD

The present invention relates to a secondary battery state detecting device and a secondary battery state detecting method.

BACKGROUND ART

To improve fuel economy, vehicles are recently being provided with, for example, an idle reduction function that stops idling when the vehicle is waiting at a traffic signal or the like, a function for charging a secondary battery with regenerative power obtained by increasing the voltage generated by an alternator while decelerating, and the like. To use these functions effectively, it is necessary to accurately detect a state of the secondary battery, and determine whether or not to enable the idle reduction function, adjust the generated voltage, and the like on the basis of the detected state. The technique disclosed in Patent Document 1 can be given as an example of a conventional technique for detecting the state of a secondary battery. According to the technique disclosed in Patent Document 1, a voltage and a current of the secondary battery are measured, the measured voltage value and current value are converted into a frequency domain through a Fourier transformation, and a complex impedance is found. An equivalent circuit is then found from the obtained complex impedance, and the state of the secondary battery is detected on the basis of the equivalent circuit.

CITATION LIST

Patent Document

Patent Document 1: Japanese Unexamined Patent Application Publication No. 2005-221487A

SUMMARY OF INVENTION

Technical Problem

Incidentally, a secondary battery installed in a vehicle is sometimes replaced with a new secondary battery when the original secondary battery has reached its end of life or the like. When a secondary battery has been replaced with a new secondary battery, it is necessary to update the element values of the equivalent circuit and update a usage history such as a cumulative current value and the like of the secondary battery in order to detect the state accurately. However, there is a problem in that no technique has been developed for accurately detecting the replacement of a secondary battery.

An object of the present invention is to provide a secondary battery state detecting device and a secondary battery state detecting method capable of accurately detecting that a secondary battery has been replaced.

Solution to Problem

To solve the problem described above, a secondary battery state detecting device of the present invention that detects a state of a secondary battery installed in a vehicle includes: a learning means that learns element values of an equivalent circuit of a secondary battery on the basis of a voltage and a current of the secondary battery; and a determination means that compares the element values obtained through learning at different timings by the learning means and, when at least one of the element values has changed more than or equal to a predetermined threshold value, determines that the secondary battery has been replaced.

According to this configuration, the replacement of a secondary battery can be accurately detected.

Additionally, in the present invention, when an electric double layer capacity forming the equivalent circuit changes more than or equal to the predetermined threshold value and a change in reaction resistance is less than or equal to a predetermined threshold value, the determination means determines that the secondary battery has been replaced with the same type of secondary battery having a different degree of degradation.

According to this configuration, the replacement of a degraded secondary battery with a new secondary battery of the same type can be accurately determined.

Additionally, in the present invention, when the reaction resistance forming the equivalent circuit changes more than or equal to a predetermined threshold value, the determination means determines that the secondary battery has been replaced with a different type of secondary battery.

According to this configuration, the replacement of a secondary battery by a driver with a secondary battery of a different type can be accurately determined.

Additionally, the present invention further includes deletion means that deletes element values of the equivalent circuit learned in the past and stored in a memory device, when the determination means determines that the secondary battery has been replaced.

According to this configuration, the element values are deleted and, therefore, an equivalent circuit of the new secondary battery replaces that of the old secondary battery and the state of the new secondary battery can be accurately detected.

Additionally, in the present invention, when the determination means determines that the secondary battery has been replaced, the deletion means deletes information showing usage history of the secondary battery that is stored in the memory device.

According to this configuration, the usage history is deleted and, therefore, the new secondary battery can be accurately controlled.

Additionally, in the present invention, the element values of the equivalent circuit are corrected so as to be element values at a reference temperature and a reference state of charge (SOC).

According to this configuration, regardless of the values of the temperature and the SOC, the occurrence of replacement can be accurately determined.

Additionally, a secondary battery state detecting method of the present invention for detecting a state of a secondary battery installed in a vehicle includes: a learning step of learning element values of an equivalent circuit of a secondary battery on the basis of a voltage and a current of the secondary battery; and a determining step of comparing the element values obtained through learning at different timings in the learning step and, when at least one of the element values has changed more than or equal to a predetermined threshold value, determining that the secondary battery has been replaced.

According to this method, the replacement of a secondary battery can be accurately detected.

Advantageous Effects of Invention

According to the present invention, a secondary battery state detecting device and a secondary battery state detecting method can be provided that are capable of accurately detecting that a secondary battery has been replaced.

DESCRIPTION OF EMBODIMENT

An embodiment of the present invention will be described below.

(A) Explanation of Configuration of the Embodiment

Figure 1:
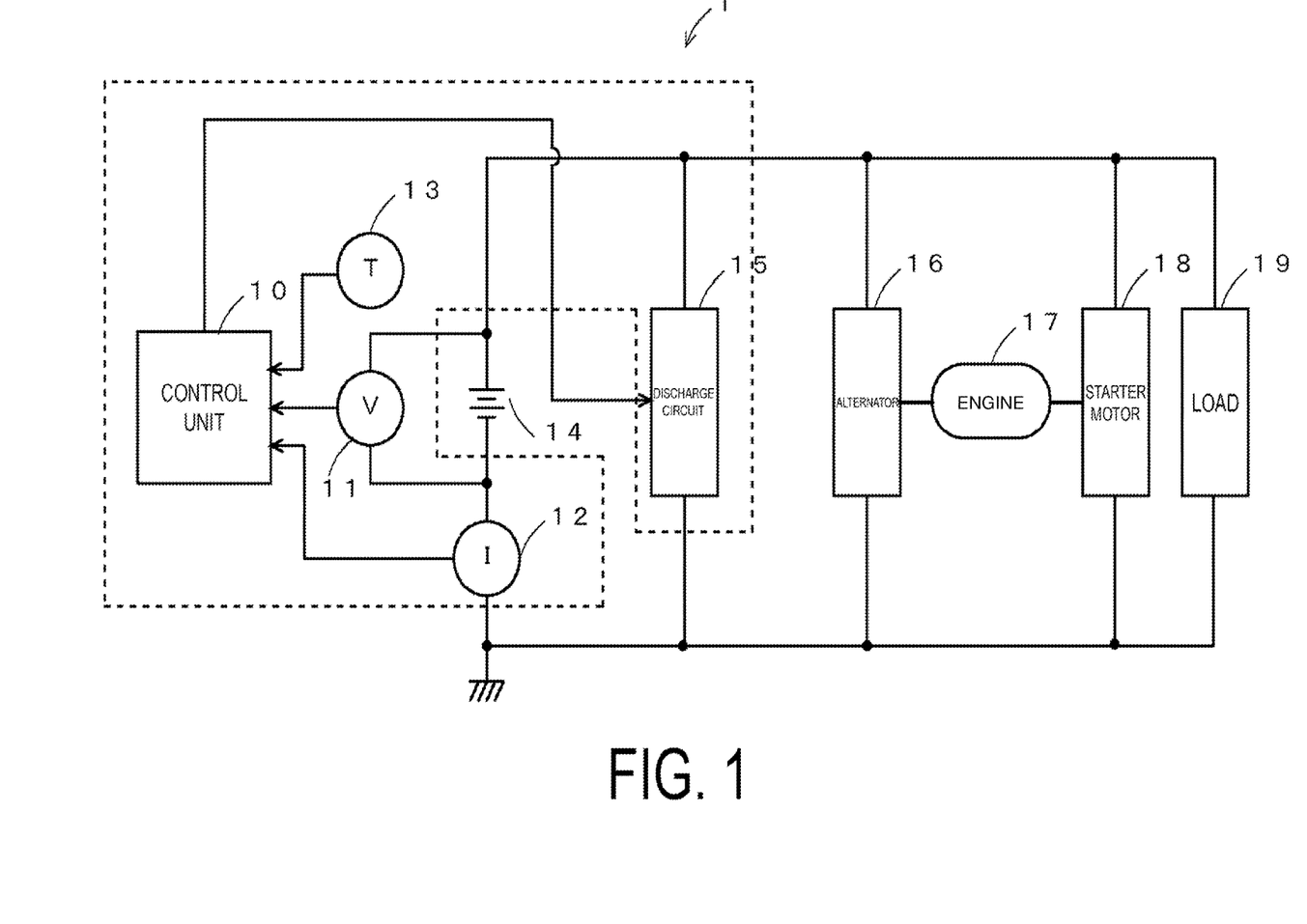
FIG. 1 illustrates an example of a configuration of a secondary battery state detecting device according to an embodiment of the present invention.

FIG. 1 is a drawing that illustrates a vehicle power supply system equipped with a secondary battery state detecting device according to the embodiment of the present invention. In the drawing, the secondary battery state detecting device 1 includes the following primary components: a control unit 10, a voltage sensor 11, a current sensor 12, a temperature sensor 13, and a discharge circuit 15; and detects a state of a secondary battery 14. Here, the control unit 10 detects the state of the secondary battery 14 while referencing output from the voltage sensor 11, the current sensor 12, and the temperature sensor 13. The voltage sensor 11 detects the terminal voltage of the secondary battery 14 and sends the result to the control unit 10. The current sensor 12 detects the current flowing to the secondary battery 14 and sends the result to the control unit 10. The temperature sensor 13 detects the temperature of the secondary battery 14 itself or the ambient temperature therearound and sends the result to the control unit 10. The discharge circuit 15, which is constituted of, for example, a semiconductor switch, a resistance element, and the like connected in series, intermittently discharges the secondary battery 14 through on/off control of the semiconductor switch performed by the controller 10.

The secondary battery 14, which is constituted of, for example, a lead-acid battery, a nickel-cadmium battery, a nickel-metal hydride battery, a lithium-ion battery, or the like, is charged by an alternator 16. In addition, the secondary battery 14 drives a starter motor 18 to start an engine and supplies electric power to a load 19. The alternator 16 is driven by the engine 17 to generate AC power that is converted to DC power by a rectifier circuit; the secondary battery 14 is then charged with the DC power.

The engine 17 is a reciprocating engine such as a petrol engine or a diesel engine, or a rotary engine, for example. The engine 17 is started by the starter motor 18 and drives drive wheels via a transmission to supply propulsive power to the vehicle. The engine 17 also drives the alternator 16 to generate electric power. The starter motor 18 is a DC motor, for example, and generates a rotational force using electric power supplied from the secondary battery 14 to start the engine 17. Examples of the load 19 include an electric power steering motor, a defogger, an ignition coil, a car audio system, and a car navigation system, and run on electric power from the secondary battery 14.

Figure 2:
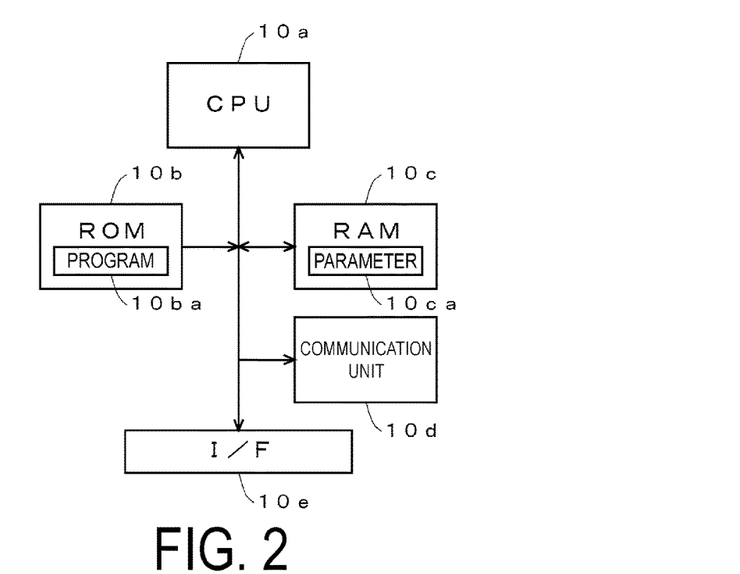
FIG. 2 is a block diagram illustrating a detailed example of a configuration of the control unit illustrated in FIG. 1.

FIG. 2 illustrates an example of a configuration of the control unit 10 illustrated in FIG. 1 in detail. As illustrated in FIG. 2, the control unit 10 includes a central processing unit (CPU) 10a, a read-only memory (ROM) 10b, a random access memory (RAM) 10c, a communication unit 10d, and an interface (I/F) 10e. Here, the CPU 10a controls components according to a program 10ba stored in the ROM 10b. The ROM 10b, which is, for example, a semiconductor memory, stores the program 10ba and the like. The RAM 10c, which is, for example, a semiconductor memory, stores parameters 10ca such as data generated during the execution of the program 10ba, and tables and mathematical expressions described later. The communication unit 10d performs communication with a higher-level device, namely, an electronic control unit (ECU), and reports detected information to the higher-level device. The I/F 10e converts signals sent from the voltage sensor 11, the current sensor 12, and the temperature sensor 13 to digital signals and imports the resulting signals, and furthermore supplies a driving current to the discharge circuit 15 and carries out control thereof.

(B) Explanation of Principles of the Embodiment

Figure 3:
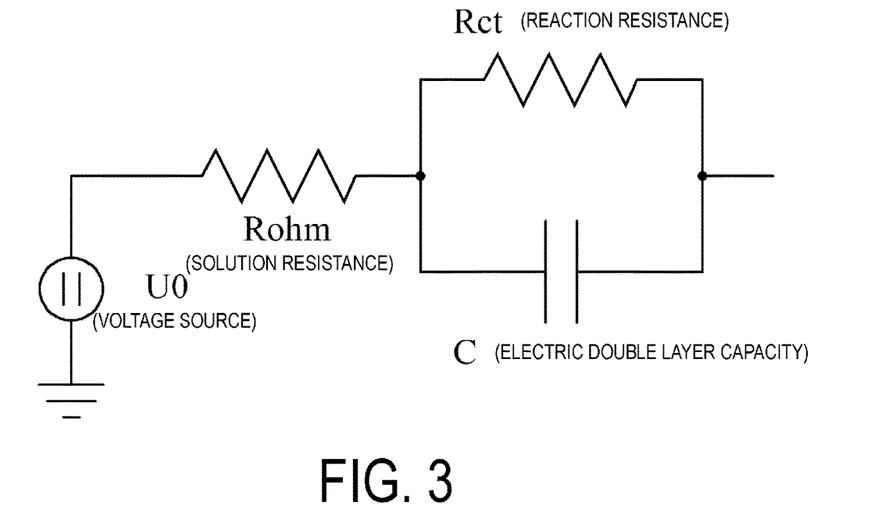
FIG. 3 is an example of an equivalent circuit of a secondary battery for use in the embodiment of the present invention.

Next, the operation principles of the embodiment of the present invention will be described while referencing the drawings. In the present embodiment, an equivalent circuit of the secondary battery 14 having the configuration illustrated in FIG. 3 is obtained through learning processing. Additionally, each time the learning processing is executed, a newly obtained element value is compared with an element value obtained in the past and, when the element value changes in a discontinuous manner, it is determined that the secondary battery 14 has been replaced.

Figure 4:
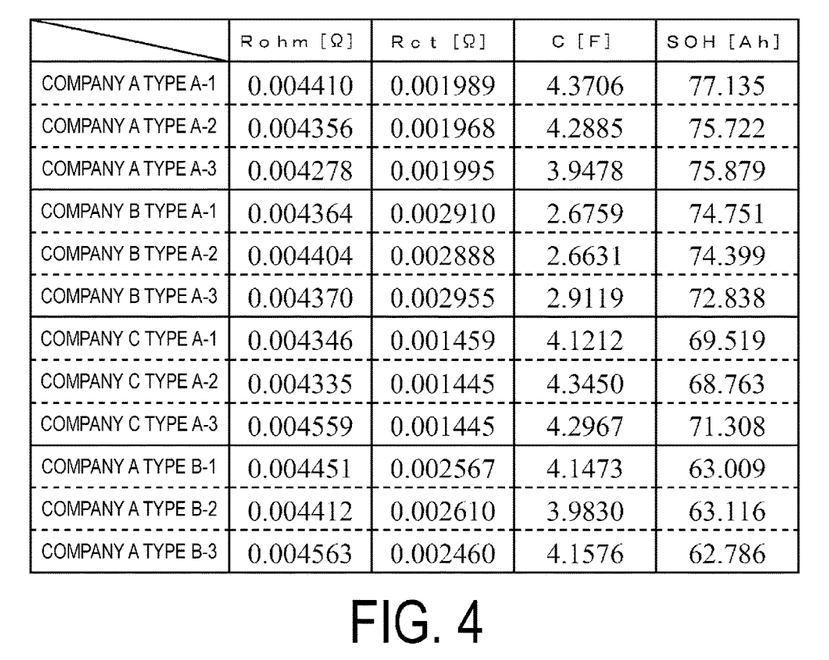
FIG. 4 is a table showing element values of equivalent circuits for different types of secondary batteries.

FIG. 4 shows the element values of equivalent circuits for different types of secondary batteries of substantially the same size. In this example, four types of secondary batteries are shown, namely Company A Type A, Company B Type A, Company C Type A and Company A Type B. Three individual units (1 to 3) of each type of the secondary batteries are shown as samples. Note that "SOH" on the right side of the table is the state of health (SOH) at the time of measurement of each of the secondary batteries. As shown in FIG. 4, there is nearly no change in solution resistance Rohm across the types of secondary batteries. The values of electric double layer capacity C shows a slight change for Company B Type A, but for all other samples, nearly no change is observed. On the other hand, while changes between individual units are small for the reaction resistance Rct, changes are great between the types of secondary batteries. As such, it is possible to detect that the secondary battery has been replaced with a different type of secondary battery by measuring the change in reaction resistance.

Figure 5:
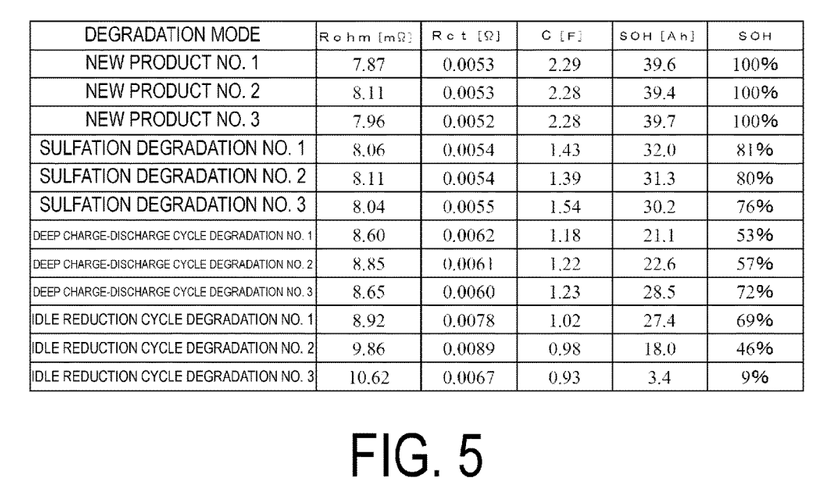
FIG. 5 is a table showing element values of equivalent circuits of secondary batteries of the same type that are in different states of degradation.

FIG. 5 shows element values of equivalent circuits for new secondary batteries and degraded secondary batteries of the same type. Here, new products No. 1 to No. 3 are new secondary batteries. Sulfation degradation No. 1 to No. 3 are secondary batteries which have been unused for an extended period of time in a low SOC state and in which sulfation degradation has occurred. Deep charge-discharge cycle degradation No. 1 to No. 3 are secondary batteries that have degraded due to deep charge-discharge cycles in which a full charge state and a low SOC state are repeated. Idle reduction cycle degradation No. 1 to No. 3 are secondary batteries that have degraded through SBA S0101 testing stipulated by the Battery Association of Japan. Note that "SOH (Ah)" second from the right in the table is the state of health (SOH) shown in terms of Ah, and the "SOH" on the right side of the table is the state of health (SOH) shown as a percentage. As shown in FIG. 5, when a secondary battery degrades, the electric double layer capacity C changes greatly compared to when new. As such, it is possible to detect that the secondary battery has been replaced with the same type of secondary battery having a different degree of degradation by measuring the change in the electric double layer capacity.

That is, in the embodiment of the present invention, the CPU 10a executes processing to learn the equivalent circuit of the secondary battery 14 and finds the element values when, for example, a predetermined period of time has passed after the engine 7 has stopped, or, upon execution of a power-on reset of the secondary battery state detecting device 1. When the element values have been found by the learning processing, the CPU 10a acquires element values found through processing in the past and stored in the RAM 10c, and compares these past element values with the newly found element values. More specifically, the CPU 10a determines if |Rctm−Rct1|, which is the absolute value of the difference between the reaction resistance Rctm obtained through processing in the past and the newly found reaction resistance Rct1, is greater than a predetermined threshold value Th1, and when the difference is determined to be greater than the predetermined threshold value Th1, it is determined that the secondary battery 14 has been replaced with a different type of secondary battery. Moreover, when it is determined that the secondary battery 14 has been replaced with a difference type of secondary battery, the past element values stored in the RAM 10c are deleted and the usage history of the secondary battery 14 is also deleted from the RAM 10c. Note that the usage history is, for example, information of the cumulative charge and discharge current, usage time, and environmental temperature history of the secondary battery 14, traveling distance, and the like. The CPU 10a deletes these usage histories from the RAM 10c.

Next, the CPU 10a determines if |Cm−C1|, which is the absolute value of the difference between the electric double layer capacity Cm obtained through processing in the past and the newly found electric double layer capacity C1, is greater than a predetermined threshold value Th2, and when the absolute value of the difference is determined to be greater than the predetermined threshold value Th2, it is determined that the secondary battery 14 has been replaced with the same type of secondary battery. Moreover, when it is determined that the secondary battery 14 has been replaced with the same type of secondary battery, the past element values stored in the RAM 10c are deleted and the usage history of the secondary battery 14 is also deleted from the RAM 10c. Note that the usage history is the same as that described previously.

The preceding is a description of operations for cases in which the secondary battery 14 is replaced with a different type or the same type of secondary battery 14 but, for example, when a power-on reset is executed without replacing the secondary battery 14, there will be no change in the element values of the equivalent circuit and, therefore, the element values of the equivalent circuit and the usage history are not deleted.

According to the processing described above, replacement of the secondary battery 14 is detected from the change in the element values of the equivalent circuit and, therefore, replacement of the secondary battery 14 can be accurately detected. Additionally, it is possible to identify if the secondary battery 14 has been replaced with a different type or the same type of secondary battery on the basis of the type of element values that change. Therefore, for example, when the secondary battery 14 has been replaced with a different type of secondary battery, the state detection accuracy may decline compared to the same type of secondary battery 14, and, as such, charging control and the like can be carried out with a margin during controlling set on the large side.

Figure 6:
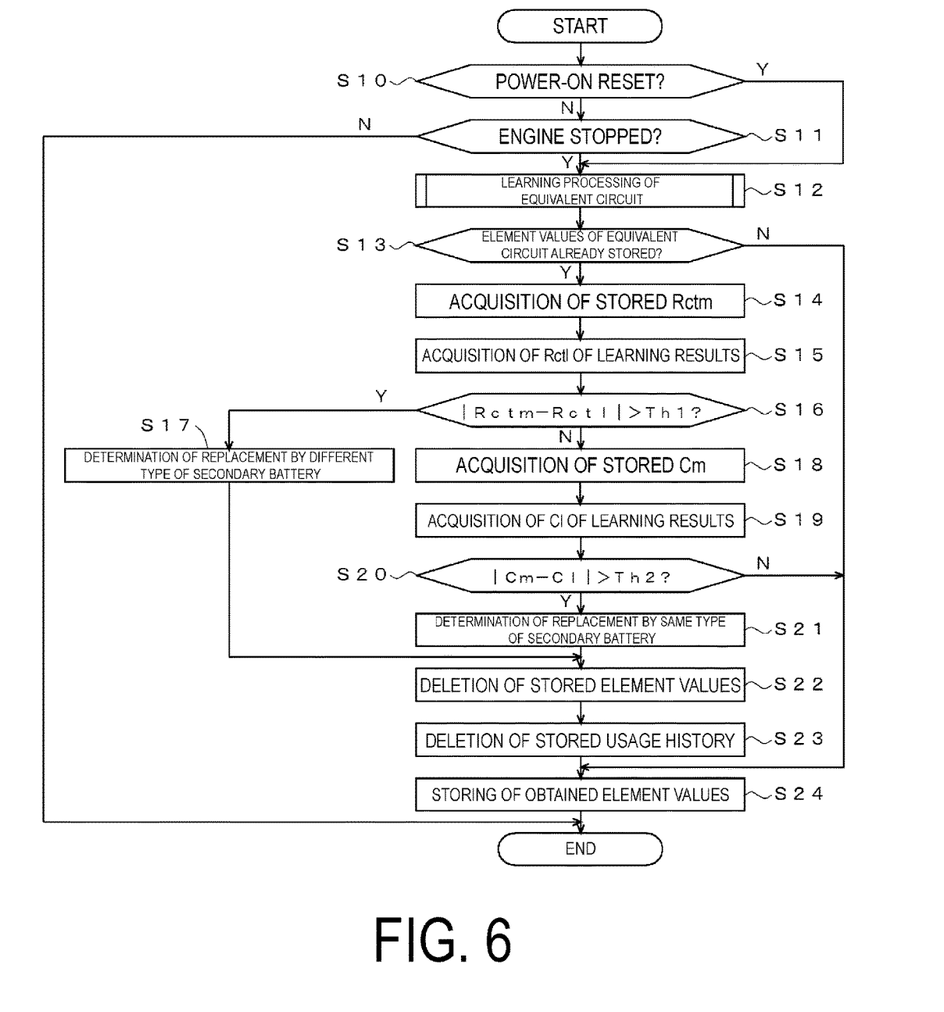
FIG. 6 is a flowchart for explaining an example of processing that is executed in the embodiment of the present invention.

Next, detailed operations of the embodiment of the present invention will be described while referring to FIGS. 6 and 7. FIG. 6 is a flowchart for explaining an example of processing that is executed in the embodiment illustrated in FIG. 1. Once the flowchart starts, the following steps are executed.

In step S10, the CPU 10a determines whether or not a power-on reset has been executed. In a case where it is determined that a power-on reset has been executed (step S10: Yes), step S12 is executed and, in all other cases (step S10: No), step S11 is executed. Note that the term "power-on reset" refers to a reset from a power-on in which the connection between the secondary battery state detecting device 1 and the secondary battery 14 is cut and, thereafter reconnected so as to restart the supply of power.

For example, in step S11, the CPU 10a references a charge current flowing to the secondary battery 14 using the current sensor 12, and determines whether or not the engine 17 has stopped. In a case where it is determined that the engine 17 has stopped (step S11: Yes), step S12 is executed, and in all other cases (step S11: No), the processing is terminated.

In step S12, the CPU 10a executes learning processing of the equivalent circuit (see FIG. 3) of the secondary battery 14. Note that details of the processing of step S12 are given later while referring to FIG. 7.

In step S13, the CPU 10a determines whether or not the element values of the equivalent circuit are already stored in the RAM 10c and, in a case where the element values are already stored (step S13: Yes), step S14 is executed, and in all other cases (step S13: No) step S24 is executed. For example, in cases immediately following the assembly of the vehicle on the assembly line, the element values of the equivalent circuit are not stored in the RAM 10c. In such cases, the determination in S13 is "No", and step S24 is executed.

In step S14, the CPU 10a acquires the reaction resistance Rctm of the equivalent circuit (calculated in the past) stored in the RAM 10c.

In step S15, the CPU 10a acquires the reaction resistance Rct1 obtained through the learning processing of step S12.

In step S16, the CPU 10a determines if |Rctm−Rct1|, which is the absolute value of the difference between the past reaction resistance Rctm and the new reaction resistance Rct1, is greater than the predetermined threshold value Th1, and in a case of |Rctm−Rct1|>Th1 (step S16: Yes), step S17 is executed, and in all other cases (step S16: No), step S18 is executed. For example, in a case where the secondary battery 14 is replaced with a different type of secondary battery, the relationship |Rctm−Rct1|>Th1 is true, which causes step S17 to be executed.

In step S17, the CPU 10a determines that the secondary battery 14 has been replaced with a different type of secondary battery, and step S22 is executed. Note that the determination that the secondary battery 14 has been replaced with a different type of secondary battery may, for example, be reported to a user by reporting the results to a higher-level device via the communication unit 10d and the higher-level device displaying the determination results on a display or the like.

In step S18, the CPU 10a acquires the electric double layer capacity Cm of the equivalent circuit (calculated in the past) stored in the RAM 10c.

In step S19, the CPU 10a acquires the electric double layer capacity C1 obtained through the learning processing in step S12.

In step S20, the CPU 10a determines if |Cm−C1|, which is the absolute value of the difference between the past electric double layer capacity Cm and the new electric double layer capacity C1, is greater than the predetermined threshold value Th2, and in a case of |Cm−C1|>Th2 (step S20: Yes), step S21 is executed, and in all other cases (step S20: No), step S24 is executed. For example, in a case where the secondary battery 14 is replaced with the same type of secondary battery, the relationship |Cm−C1|>Th2 is true, which causes step S21 to be executed.

In step S21, the CPU 10a determines that the secondary battery 14 has been replaced with the same type of secondary battery, and step S22 is executed. Note that the determination that the secondary battery 14 has been replaced with the same type of secondary battery may, for example, be reported to a user by reporting the results to a higher-level device via the communication unit 10d and the higher-level device displaying the determination results on a display or the like.

In step S22, the CPU 10a deletes the element values (the solution resistance Rohm, the reaction resistance Rct, and the electric double layer capacity C) of the equivalent circuit stored in the RAM 10c.

In step S23, the CPU 10a deletes the usage history stored in the RAM 10c. Note that the usage history includes cumulative charge and discharge current, usage time, environmental temperature history, and traveling distance, and the CPU 10a deletes this information from the RAM 10c.

In step S24, the CPU 10a stores the new element values of the equivalent circuit found through the learning processing shown in step S12 in the RAM 10c, and the processing is terminated. Note that upon execution of the processing of step S24, thereafter, step S13 is determined to be "Yes" and step S14 is executed.

Figure 7:
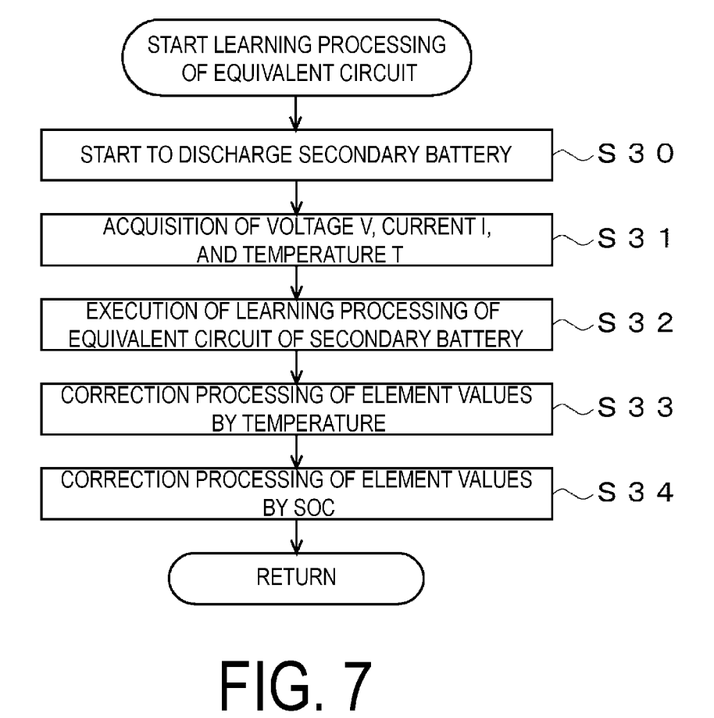
FIG. 7 is a flowchart for explaining in detail the processing of step S12 in FIG. 6.

Next, details of the processing of step S12 shown in FIG. 6 are described while referring to FIG. 7. Upon execution of the process shown in FIG. 7, the following steps are executed.

In step S30, the CPU 10a controls the discharge circuit 15 so as to pulse discharge the secondary battery 14 at a predetermined frequency and a predetermined current value.

In step S31, the CPU 10a measures a voltage V, a current I, and a temperature T of the secondary battery 14 during the discharging by referencing the output of the voltage sensor 11, the current sensor 12, and the temperature sensor 13.

In step S32, the CPU 10a executes learning processing of the equivalent circuit of the secondary battery 14. For example, the CPU 10a finds the element values of the equivalent circuit illustrated in FIG. 3 on the basis of the voltage V and the current I measured in step S31, on the basis of an algorithm such as a Kalman filter, or support vector machine.

In step S33, the CPU 10a corrects the element values of the equivalent circuit found in step S32 to element values at a reference temperature (e.g. 25° C.). Note that, for example, tables showing changes by temperature of each element value or mathematical expressions are stored in the RAM 10a in order to enable the correction processing. The element values can be corrected to element values at the reference temperature on the basis of the temperature T measured in step S31 and the tables or mathematical expressions.

In step S34, the CPU 10a corrects the element values of the equivalent circuit found in step S32 to element values at a reference SOC (e.g. 100%). Note that, for example, tables showing changes by SOC of each element value or mathematical expressions are stored in the RAM 10a in order to enable the correction processing. The element values can be corrected to element values at the reference SOC on the basis of an SOC value at that point in time and the tables or mathematical expressions. Upon completion of the correction processing for temperature and SOC, the processing returns to that of FIG. 6.

As described above, according to the embodiment of the present invention, the occurrence of replacement of the secondary battery 14 is determined from the change in the element values of the equivalent circuit and, therefore, replacement of the secondary battery 14 can be accurately determined.

Additionally, in the present embodiment, whether the secondary battery 14 has been replaced with a different type or the same type of secondary battery is identified through the changes in the reaction resistance Rct and the electric double layer capacity C. Therefore, control (e.g. charging control) is executed in accordance with the type of secondary battery that the secondary battery 14 is replaced with and, as a result, shortening of the lifespan of the secondary battery 14 can be prevented and fuel consumption can be improved due to optimal control.

Additionally, in the present embodiment, when the secondary battery 14 has been replaced, the element values of the equivalent circuit are deleted. Therefore, the learning processing is initialized and, as a result, the equivalent circuit of the secondary battery 14 can be optimized in a short period of time.

Additionally, in the present embodiment, when the secondary battery 14 has been replaced, the usage history is deleted. Therefore, state detection and control can be executed on the basis of new usage history.

Additionally, in the present embodiment, when it is determined that the secondary battery 14 has not been replaced, the element values of the equivalent circuit and the usage history are not deleted, even in cases where a power-on reset is executed. As a result, for example, when installing a new electronic device, in cases where a terminal of the secondary battery 14 is removed, accidental deletion of the element values of the equivalent circuit and the usage history can be prevented.

(D) Description of Alternate Embodiment

It is needless to say that the embodiment described above is only an example and the present invention is not limited to the embodiment as described above. For example, in the embodiment described above, the reaction resistance Rct and the electric double layer capacity C are used independently to determine the replacement of the secondary battery 14. However, for example, a configuration is possible in which the occurrence of the replacement of the secondary battery 14 is determined by comparing a value K obtained from Formula (1) below and a threshold value. Note that W1, W2, and W3, which are weighting factors, are set so that a change in K reaches a maximum when the secondary battery 14 is replaced with either the same type or a different type of secondary battery.

$$K = W1 \times \text{Rohm} + W2 \times \text{Rct} + W3 \times C \quad (1)$$

Note that a configuration is possible in which replacement of the secondary battery 14 with the same type or a different type of secondary battery is identified by adjusting the weighting factors W1, W2, and W3 so that K reaches a maximum when the secondary battery 14 has been replaced with the same type of secondary battery or K reaches a maximum when the secondary battery 14 has been replaced with a different type of secondary battery.

Additionally, in the flowchart shown in FIG. 6, the learning processing of the equivalent circuit is executed after the engine 17 has stopped, but a configuration is possible in which the learning processing is executed at other timings.

Additionally, in the flowchart shown in FIG. 6, determination that the secondary battery 14 has been replaced is made upon a single determination that the conditions are satisfied in the processing of step S16 and step S20. However, for example, a configuration is possible in which determination that the secondary battery 14 has been replaced is made in cases where the same determination is made a plurality of continuous times. According to such a method, the occurrence of incorrect determinations due to calculation errors and the like can be prevented.

Additionally, a configuration is possible in which the determination results of step S17 and step S21 of the flowchart shown in FIG. 6 are, for example, displayed on a display and a user confirms whether or not these determinations are correct; and, depending on the results of the confirmation, the element values and the usage history are deleted. According to such a method, the deletion of the element values and the usage history due to incorrect determinations can be prevented.

Additionally, a configuration is possible in which the element values of the equivalent circuit and the usage history that are stored in the RAM 10c can be deleted on the basis of a command from a user. That is, a configuration is possible in which the element values stored in the RAM 10c are deleted in cases where a user commands, from a higher-level device, that the element values of the equivalent circuit be deleted. The same is true for the usage history. According to such a configuration, the element values of the equivalent circuit and the usage history can be deleted on the basis of the intention of the user.

Additionally, in the embodiment described above, the element values of the equivalent circuit of the secondary battery 14 are found by providing a discharge circuit 15 and performing pulse discharging using the discharge circuit 15. However, a configuration is possible in which the discharge circuit 15 is not provided and the element values of the equivalent circuit are found from current flowing through the load and the voltage behavior at that time. According to such a configuration, the discharge circuit 15 can be removed, and declines in the amount of charge of the secondary battery 14 due to the discharging for finding the element values can be avoided. Additionally, a configuration is possible in which the element values of the equivalent circuit of the secondary battery 14 are found from charge current instead of from discharge current.

REFERENCE SIGNS LIST

1 Secondary battery state detecting device
10 Control Unit
10a CPU (learning means, determination means, deletion means)
10b ROM
10c RAM (memory device)
10d Communication unit
10e I/F
11 Voltage sensor
12 Current sensor
13 Temperature sensor
14 Secondary battery
15 Discharge circuit
16 Alternator
17 Engine
18 Starter motor
19 Load

The invention claimed is:

1. A secondary battery state detecting device that detects a state of a secondary battery installed in a vehicle, the device comprising:
   a learning means that learns element values of an equivalent circuit of a secondary battery on the basis of a voltage and a current of the secondary battery; and
   a determination means that compares the element values obtained through learning at different timings by the learning means and, when at least one of the element values has changed more than or equal to a predetermined threshold value, determines that the secondary battery has been replaced, wherein
   an equivalent circuit model includes at least a solution resistance and a reaction resistance,
   the learning means learns the solution resistance and the reaction resistance constituting the equivalent circuit as independent elements, and
   the determination means determines whether or not the secondary battery has been exchanged using at least one of the solution resistance and the reaction resistance.

2. The secondary battery state detecting device according to claim 1, wherein:
   when an electric double layer capacity forming the equivalent circuit changes more than or equal to a predetermined threshold value and a change in the reaction resistance is less than or equal to a predetermined threshold value, the determination means determines that the secondary battery has been replaced with a same type of secondary battery having a different degree of degradation.

3. The secondary battery state detecting device according to claim 1, wherein:
when the reaction resistance forming the equivalent circuit changes more than or equal to a predetermined threshold value, the determination means determines that the secondary battery has been replaced with a different type of secondary battery.

4. The secondary battery state detecting device according to claim 1, further comprising:
a deletion means that deletes element values of the equivalent circuit learned in the past and stored in a memory device, when the determination means determines that the secondary battery has been replaced.

5. The secondary battery state detecting device according to claim 4, wherein:
when the determination means determines that the secondary battery has been replaced, the deletion means deletes information showing usage history of the secondary battery that is stored in the memory device.

6. The secondary battery state detecting device according to claim 1, wherein:
the element values of the equivalent circuit are corrected so as to be element values at a reference temperature and a reference state of charge (SOC).

7. The secondary battery state detecting device according to claim 1, further comprising:
an acquiring means that acquires an element value stored in random access memory as obtained by a previous learning processing; and
a judging means that judges by comparing the element values with a newly obtained element value.

8. A secondary battery state detecting method for detecting a state of a secondary battery installed in a vehicle, the method comprising:
a learning step of learning element values of an equivalent circuit of a secondary battery on the basis of a voltage and a current of the secondary battery; and
a determining step of comparing the element values obtained through learning at different timings in the learning step and, when at least one of the element values has changed more than or equal to a predetermined threshold value, determining that the secondary battery has been replaced, wherein
an equivalent circuit model includes at least a solution resistance and a reaction resistance,
the learning step comprises learning the solution resistance and the reaction resistance constituting the equivalent circuit as independent elements, and
the determination step comprises determining whether or not the secondary battery has been exchanged using at least one of the solution resistance and the reaction resistance.

9. The secondary battery state detecting method according to claim 8, further comprising:
a deletion step of deleting element values of the equivalent circuit learned in the past and stored in a memory device, when the determination step comprises determining that the secondary battery has been replaced.

10. The secondary battery state detecting method according to claim 9, wherein:
when the determination step comprises determining that the secondary battery has been replaced, and the deletion step comprises deleting information showing usage history of the secondary battery that is stored in the memory device.

* * * * *